(12) United States Patent
Augarten

(10) Patent No.: US 6,442,724 B1
(45) Date of Patent: Aug. 27, 2002

(54) FAILURE CAPTURE APPARATUS AND METHOD FOR AUTOMATIC TEST EQUIPMENT

(75) Inventor: Michael H. Augarten, Santa Barbara, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/285,857

(22) Filed: Apr. 2, 1999

(51) Int. Cl.$^7$ ............................................ G01R 31/28
(52) U.S. Cl. ...................................................... 714/738
(58) Field of Search ........................... 365/201, 189.07; 714/710, 711, 29, 718, 719, 738; 716/4

(56) References Cited

U.S. PATENT DOCUMENTS

| | | | |
|---|---|---|---|
| 4,628,509 A | 12/1986 | Kawaguchi | 714/711 |
| 4,736,373 A * | 4/1988 | Schmidt | 714/711 |
| 4,751,656 A * | 6/1988 | Conti et al. | 716/1 |
| 4,876,685 A | 10/1989 | Rich | 714/723 |
| 5,157,664 A * | 10/1992 | Waite | 714/710 |
| 5,317,573 A | 5/1994 | Bula et al. | 714/711 |
| 5,588,115 A * | 12/1996 | Augarten | 714/29 |
| 5,610,925 A | 3/1997 | Takahashi | 714/724 |
| 5,644,578 A | 7/1997 | Ohsawa | 714/719 |
| 5,717,694 A | 2/1998 | Ohsawa | 714/704 |
| 5,720,031 A | 2/1998 | Lindsay | 714/42 |
| 5,754,556 A | 5/1998 | Ramseyer et al. | 714/711 |
| 5,757,815 A | 5/1998 | Shimogama et al. | 714/718 |
| 5,790,559 A | 8/1998 | Sato | 714/720 |
| 5,795,797 A | 8/1998 | Chester et al. | 438/4 |
| 5,909,448 A * | 6/1999 | Takahashi | 714/719 |
| 6,115,833 A * | 9/2000 | Sato et al. | 714/718 |
| 6,173,238 B1 * | 1/2001 | Fujisaki | 702/117 |

OTHER PUBLICATIONS

Bosse, Gene P.: "High Speed Redundancy Processor," Proceedings of the International Test Conference, US, Silver Spring, IEEE Comp, vol. symp. 1984, Oct. 1, 1984, pp. 282–286, XP000746695.

Day, John, R.: "A Fault–Driven, Comprehensive Redundancy Algorithm," IEEE Design & Test of Computers, US, IEEE Computers Society, Los Alamitos, vol. 2, No. 3, Jun. 1, 1985, pp. 35–44, XP000744056.

Ritter, H.C. et al.: "Built–In Test Processor For Self–Testing Repairable Random Access Memories," Proceedings of the International Test Conference, US, Washington, IEEE Comp. Soc. Press, vol. Conv. 18, Sep. 18, 1987, pp. 1078–1084, XP002048111.

Bhavsar, Dilip K. et al.: "Testability Strategy of the Alpha AXP 21164 Microprocessor," Proceedings of the International Test Conference, US, New York, IEEE, Oct. 2, 1994, pp. 50–59, XP000519963.

* cited by examiner

*Primary Examiner*—Albert Decady
*Assistant Examiner*—Shelly A Chase
(74) *Attorney, Agent, or Firm*—Lance Kreisman (57) ABSTRACT

A failure capture circuit for identifying failure location information from a memory-under-test (MUT) having a predetermined storage capacity is disclosed. The failure capture circuit includes failure detection circuitry adapted for coupling to the MUT and operative to apply test signals to the MUT and process output signals therefrom into failure information. The failure information is indicative of failed memory cell locations. A look-up table couples to the failure detection circuitry for storing the location information, thereby minimizing the size of the look-up table and the time to transfer failure data to a redundancy analyzer.

18 Claims, 5 Drawing Sheets

FAILURE CAPTURE APPARATUS AND METHOD FOR AUTOMATIC TEST EQUIPMENT

FIELD OF THE INVENTION

The invention relates generally to automatic test equipment for testing semiconductor devices, and more particularly a failure capture apparatus and method for use in a semiconductor device tester.

BACKGROUND OF THE INVENTION

Semiconductor memory manufacturers continuously seek to minimize the costs of producing memory devices in order to remain competitive. One of the more important fabrication processes involves testing each device to ensure reliability and operability under various conditions. The equipment utilized to carry out the testing is often referred to as automatic test equipment, or "testers".

Conventional testers generally include circuitry that couples to one or more memories-under-test (MUT) and writes signals to selected locations in the MUT. The written signals are subsequently read back and captured by the tester for comparison with expected signals. The failure results of the comparison generally dictate whether the MUT passed the test or requires repair.

Many memory devices employ redundant rows and columns for use in repairing the device should fails be detected during testing. This feature substantially improves the yields in the numbers of commercially acceptable devices. Conventional memory testers typically include one or more redundancy repair stations to physically replace one or more rows or columns with available redundant rows/columns. Before the redundancy analysis can take place, however, the reliable initial capture of the failure data by the tester must occur.

Traditionally, testers have initially stored failure data in RAM memories having capacities similar in size to the MUT. Commonly referred to as catchrams, the memories typically store fail information at addresses that physically correspond to the address locations within the MUT. This approach conveniently provides a bit-image representation of the MUT, allowing a user to quickly identify clusters of fails that might relate to a particular fabrication problem. This is particularly important in an engineering development environment to diagnose processing problems in fabricating MUTs early on. Quick identification of processing problems in a production line is also important to minimize any downtime on the line and maximize product throughput and corresponding lot yields.

One construction of a catchram utilizes a 1-bit wide SRAM having a capacity substantially equivalent to that of a MUT. Known for it's relatively high speed of operation in random mode, the SRAM provides a desirable memory type from the standpoint of operation. Unfortunately, SRAM production has dropped in recent years, with future availability doubtful. Consequently, the cost of an SRAM device is fairly high.

In an effort to create an SRAM-less catchram, those skilled in the art have utilized various DRAM implementations. DRAMs are relatively inexpensive and generally provide large capacity memories suitable for bit-image catchram applications. The devices include selectable modes of operation according to either a random mode (interleave) or burst mode (sequential). Unfortunately, in the random mode, DRAMs operate at substantially slower speeds than SRAM devices, requiring special techniques in order to operate successfully in catchram applications.

One proposal for using DRAMS in a failure capture memory, disclosed in U.S. Pat. No. 5,790,559 to Sato, employs banks of interleaved DRAMs to achieve acceptable speeds of operation during the DRAM random (interleaving) mode. The banks each have a storage capacity equivalent to that of the MUT and produce outputs that are interleaved to generate a faster serial bitstream. As an alternative to the random mode of operation, the patent also discloses a technique that uses the burst mode in combination with an address converter to simultaneously store multiple bits of fail data sequentially in the capture memory.

While the Sato proposals appear beneficial for their intended applications, they employ several banks of DRAM devices for each MUT. For testers that process as many as 16 to 32 MUTs in parallel, the number of DRAMs required for all the catchrams approaches undesirable levels, both in terms of space and hardware cost. Additionally, with MUT capacities ever increasing in size, the corresponding conventional catchram capacities also increase, presenting cost concerns regarding the larger memories.

A technique proposed by Ohsawa in U.S. Pat. No. 5,644,578, allegedly addresses the memory capacity problem above by compressing failure data and storing the compressed failure data in a capture memory having a capacity less than that of a MUT. While this proposal allegedly reduces the size and cost of the capture memory, the storage scheme still relies on a physical correspondence between the position of the failed MUT memory cells and the capture memory locations.

A further compression scheme, disclosed generally in both U.S. Pat. Nos. 5,317,573 and 4,628,509, avoids the use of a catchram entirely. The technique generally includes a compressed matrix construction to track specific "must-fail" information to identify which redundant rows or columns of the MUT are required in order to repair the device. The compression matrix provides a limited number of addressable rows and columns (corresponding to the number of redundant rows and columns) that physically correspond to the failure addresses in the MUT.

While this data compression technique appears beneficial for fast production processing, the ability to provide any kind of bit-image analysis is omitted. Consequently, should devices consistently fail during production testing, any fabrication processing problems would not be readily apparent, possibly extending the time required for troubleshooting and repair.

What is needed and heretofore unavailable is a catchram construction that provides the capability of reconstructing a bit image map of the failure data from one or more MUTs, and maximizes the transfer of such information to redundancy analysis circuitry with minimal cost. The catchram and method of the present invention satisfies these needs.

SUMMARY OF THE INVENTION

The failure capture circuit of the present invention reduces costs involved in capturing and analyzing failure data from a memory-under-test (MUT). This is accomplished by storing minimal information indicative of MUT memory cell failures. By minimizing the stored failure information initially captured, subsequent transfer time for transmitting the failure information to a redundancy analysis circuit is also substantially minimized, increasing test throughput.

To realize the foregoing advantages, the invention in one form comprises a failure capture circuit for identifying failure location information from a memory-under-test (MUT) having a predetermined storage capacity. The failure capture circuit includes failure detection circuitry adapted for coupling to the MUT and operative to apply test signals to the MUT and process output signals therefrom into failure location information. A look-up table couples to the failure detection circuitry for storing the failure location information.

In another form, the invention comprises a failure processing circuit for determining failure data from a MUT and analyzing the failure data to repair the MUT. The failure processing circuit includes a failure capture circuit including failure detection circuitry adapted for coupling to the MUT and operative to apply test signals to the MUT. The failure detection circuitry also processes output signals from the MUT into failure information indicative of failed memory cell locations. A look-up table couples to the failure detection circuitry for storing the location information. The failure processing circuit further includes redundancy analysis circuitry to establish an optimal procedure for repairing the MUT. Transfer circuitry couples the redundancy analysis circuitry to the failure capture circuit and operates independently of the failure detection circuitry.

In yet another form, the invention comprises a screening circuit for distinguishing sparse-failure information from must-failure information, and selectively passing the sparse-failure information representing fail data from a MUT to a failure memory. The screening circuit also directs the sparse-fail and must-fail information to a redundancy analyzer. The screening circuit includes a column flag memory for tracking memory cell columns that have a predetermined number of failures defining must-fail columns and a row flag memory for tracking memory cell rows that have a predetermined number of failures defining must-fail rows. A row fail counter cooperates with the row and column flag memories to set flags according to pre-programmed threshold criteria.

A further form of the invention comprises a memory for use in a failure capture circuit for storing a plurality of multi-bit signals captured from a MUT. The signals have a preselected data structure. The memory includes a multi-bit input interface for receiving the multi-bit signals during a burst mode of operation and an array of storage cells disposed in communication with the input interface for storing the multi-bit signals.

In yet another form, the invention comprises a method of acquiring failure information from a MUT for subsequent redundancy analysis. The method includes the steps of capturing the failure information; identifying the locations of the failures inside the MUT from the failure information; and storing the identified failure locations in a look-up table.

In another form, the invention comprises a method of screening failure information passed to a failure capture memory adapted for storing failure address information from a MUT. The capture memory is accessible by a redundancy analysis circuit. The method includes the steps of determining must-fail information; separating the must-fail information from sparse-fail information; passing the sparse-fail information to the capture memory; and directing the must-fail information and the sparse-fail information to the redundancy analysis circuit.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
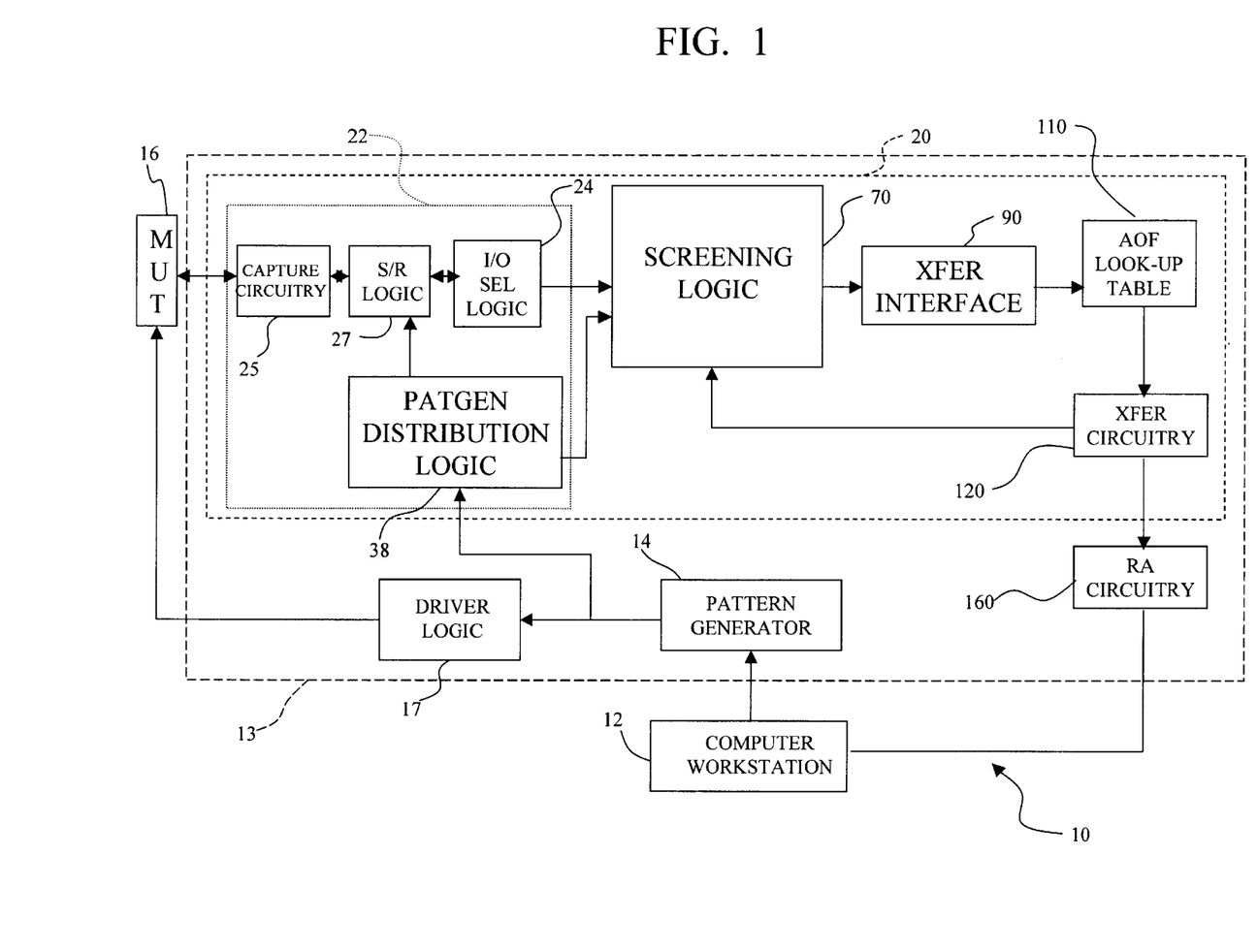
FIG. 1 is a generalized block diagram of a tester employing the failure capture apparatus of the present invention.

Referring now to FIG. 1, an abbreviated block diagram of a semiconductor memory tester according to one embodiment of the present invention, generally designated 10, includes a computer workstation 12 and a test controller 13. The test controller includes a pattern generator 14 responsive to the workstation to generate address and data signals for writing and reading to and from one or more memories-under-test (MUT) 16. The signals generated by the pattern generator access the MUT through driver circuitry 17 and write specified data to predetermined row and column address locations within the MUT. A failure capture circuit, generally designated 20, subsequently accesses the MUT in response to read signals generated by the pattern generator to read the data, and compare it to expected values in an effort to identify failed memory cell locations within the MUT.

With continued reference to FIG. 1, the failure capture circuit 20 of the present invention employs failure detection circuitry 22 and an address-of-fail look-up table 110 to maximize the transfer speed of bit-image failure information from the MUT 16 to redundancy analysis circuitry 160 with minimal hardware cost.

Further referring to FIG. 1, the failure detection circuitry 22 includes capture and compare logic for coupling to the I/O pins (not shown) of the MUT 16. The capture and compare logic includes capture circuitry 25 comprising an array of comparators (not shown) that correspond to the individual pins of the MUT according to a configuration selected by I/O selection logic 24. Each comparator feeds sync-reject logic 27 that generates sync-reject signals representative of a failed condition at a particular pin during a particular cycle of operation.

Referring again to FIG. 2, and in greater detail, the I/O selection logic 24 preferably includes a plurality of sync-reject inputs, 0 through 79, clocked through a register 28 by a pattern generator clock (BOC). The output of the register fans out along a plurality of 20:1 selector paths defined by respective multiplexers M1 through M4. The multiplexers feed respective single-bit outputs to an OR gate 30 that, in-turn couples to the input of an XOR gate 32. The XOR gate receives a secondary input from an inverted sync-reject signal INV_SR and produces an output directed through a first-in-first-out (FIFO) module 34 to an AND gate 36. The AND gate serves as the input to screening logic 70.

Figure 2:
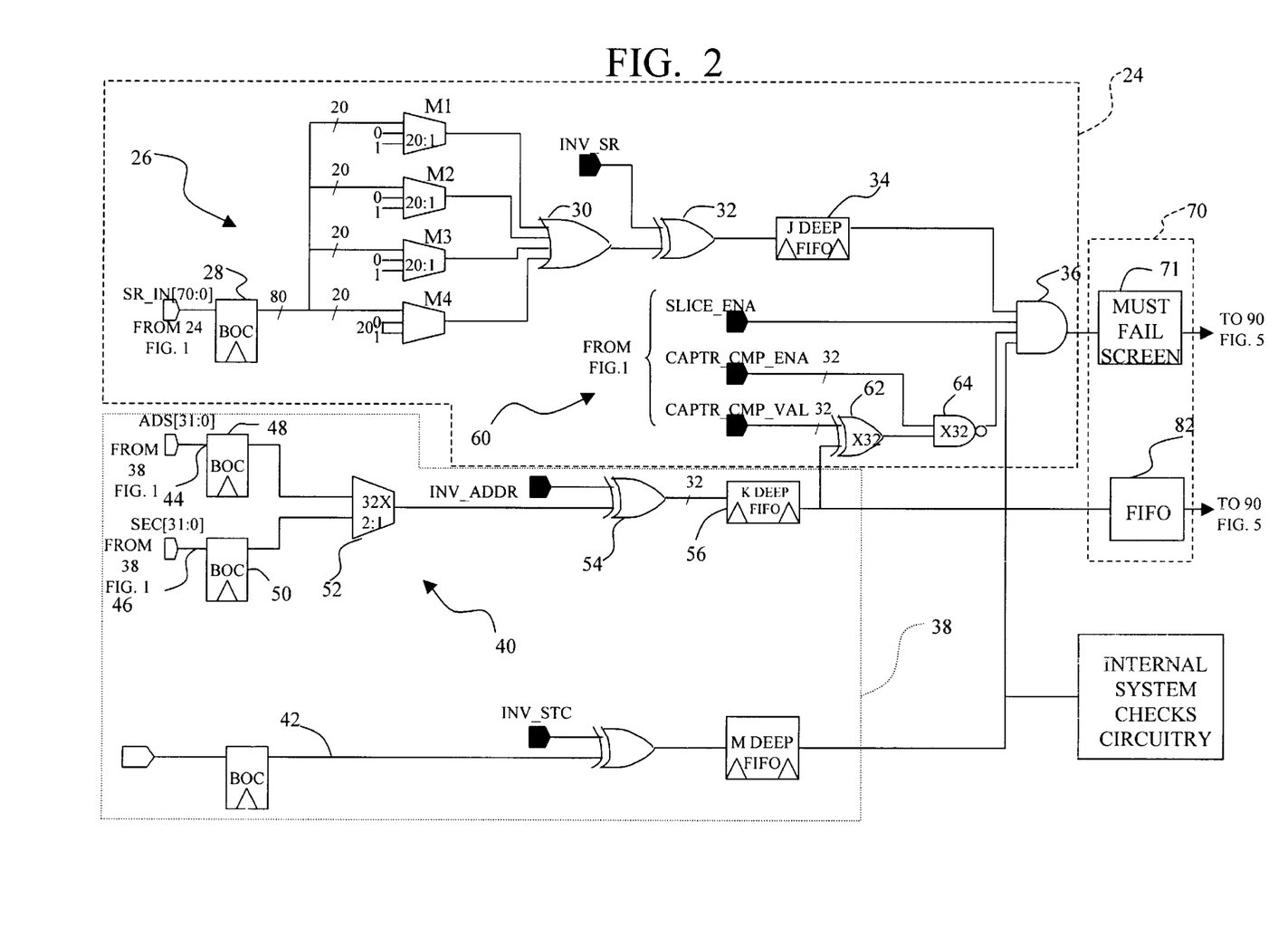
FIG. 2 is a partial schematic diagram of one embodiment of the failure capture circuit of FIG. 1.

With continued reference to FIG. 2, the pattern distribution logic 38, in preferred detail, includes an address selector 40 that feeds address and data information to the comparator circuitry 60. The pattern distribution logic also includes an STC path 42 that alerts the circuit when a pattern from the pattern generator 14 initiates and when to store data based on programmed conditions supplied by the pattern generator. The address selector 40 includes respective thirty-two bit alternative-data-source (ADS) and secondary (SEC) busses 44 and 46 that are clocked by respective registers 48 and 50 operating at the pattern generator clock (BOC). The busses feed thirty-two address-select multiplexers 52 that selectively pass single-bit outputs from one of the busses. An XOR gate 54 receives the source-select outputs and XORs them with inverted address signals INV_ADDR. A second FIFO module 56 pipes the XORed data synchronously with the first FIFO module 34 disposed in the I/O selector data stream. The output from the second FIFO is fed to the comparator circuitry 60 for comparison to the capture address register and the capture address enable. The FIFO structures described in the failure capture circuit of the present invention preferably include respective flip-flops (not shown) disposed at the respective module data inputs and outputs, but may comprise, for example, latches or memories as is well known in the art.

The comparator circuitry 60 includes an XOR gate 62 that receives and XORS 32-bit MUT value signals CAPTR_CMP_VAL with the second FIFO output 56 representing the pattern generator information. The output of the XOR gate 62 feeds a NAND gate 64 that NANDS the data with 32-bit capture enable signals CAPTR_CMP_ENA. The NAND gate output and an enable signal SLICE_ENA are directed to the input of the screening logic AND gate 36.

Referring now to FIGS. 1 through 4, the screening logic 70 includes must-fail circuitry 71 configured to carry out a must-fail analysis on the MUT 16 and inhibit the passing of unnecessary failure information to the look-up table 110. As a result, the capacity of the look-up table may be minimized, with resulting improvements in the transfer speed of failure information to the redundancy analysis circuitry 160.

Figure 3:
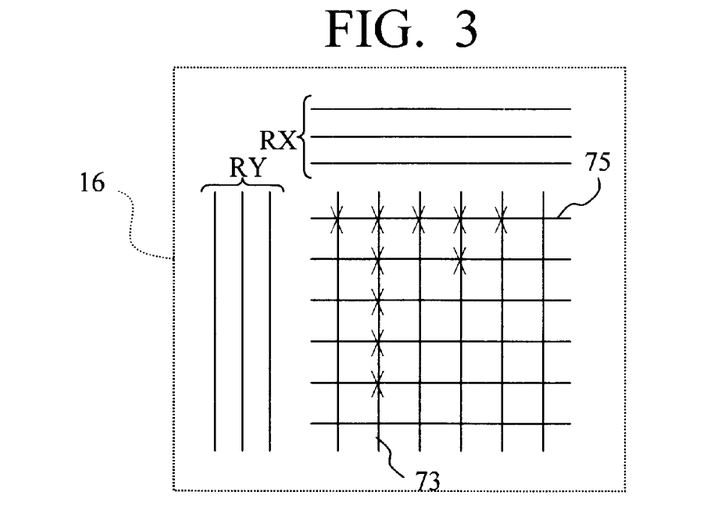
FIG. 3 is a generalized block diagram of the MUT of FIG. 1.

Referring more particularly to FIG. 3, the MUT 16 includes a predetermined number of redundant rows and columns RX and RY. Should a particular row or column have a number of failures (represented by X's) exceeding the number of redundant lines, for example, at 73 and 75, then those particular rows or columns must be completely replaced by the redundant structures. Consequently, the inventor has determined that if a row or column is to be completely replaced, then the failure information for that row need not be stored in the look-up table (since it "must" be repaired).

Figure 4:
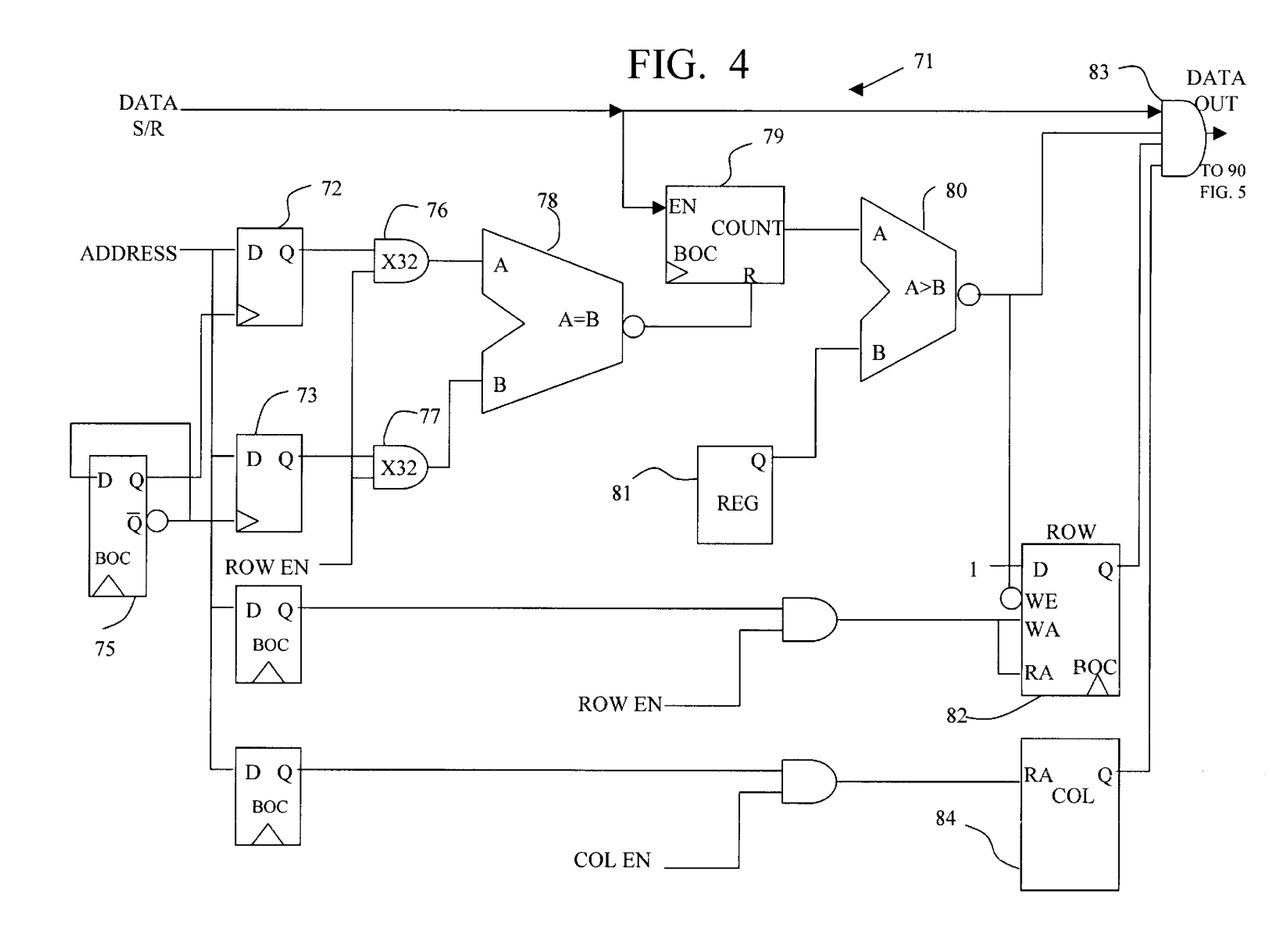
FIG. 4 is a block diagram of the must-fail circuitry of FIG. 2.

With reference now to FIG. 4, the must fail screen circuitry 71 includes a pair of address flip-flops 72 and 73 that alternate storing addresses from address bus ADDRESS according to clock signals generated by a control register 75. The flip-flops alternatingly store 32-bit addresses that feed respective AND gate arrays 76 and 77. The gate arrays selectively exclude predetermined addresses. A comparator 78 receives the output of the AND gate arrays and compares the current address (stored in one of the flip-flops) with the previous address (stored in the other flip-flop). A row counter 79 is coupled to the sync-reject signal path DATA S/R and increments each time a failure (sync-reject) is detected. The counter includes a reset R that clears the counter in response to a high comparator output. Generally, if the row of the current and previous addresses is the same, the output from the comparator is low. If the rows are different, then the comparator output is high, resetting the counter.

The output from the row counter 79 is fed to a second comparator 80 that compares the count to a pre-programmed threshold count maintained in register 81. Exceeding the threshold causes the comparator to send a write enable signal to a row flag memory 82, and a logic low to the screening logic data output AND gate 83, inhibiting further failure data for that row to load into the catchram.

Figure 5:
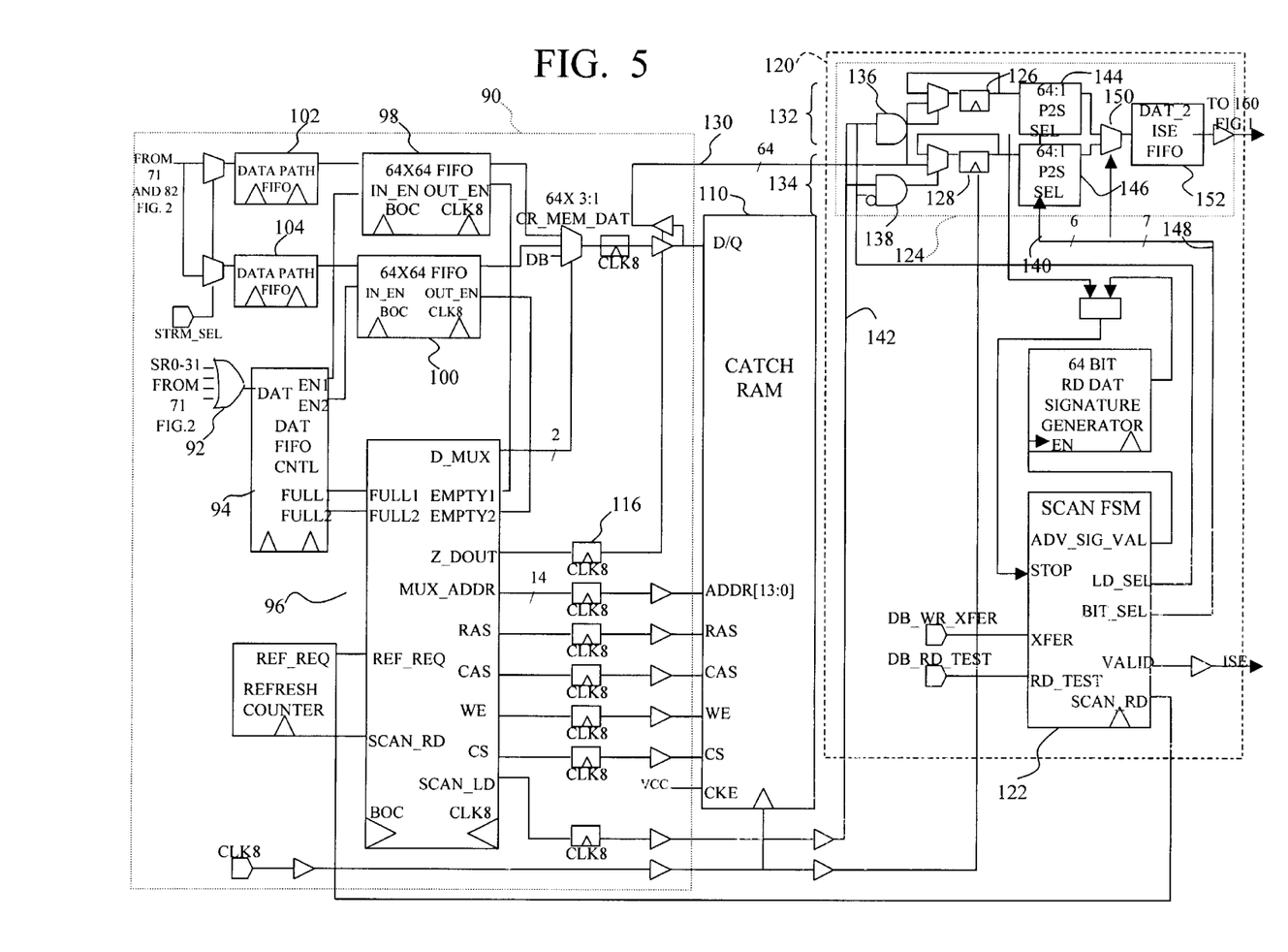
FIG. 5 is a partial schematic diagram of one embodiment of the failure capture circuit of FIG. 1.
Figure 6:
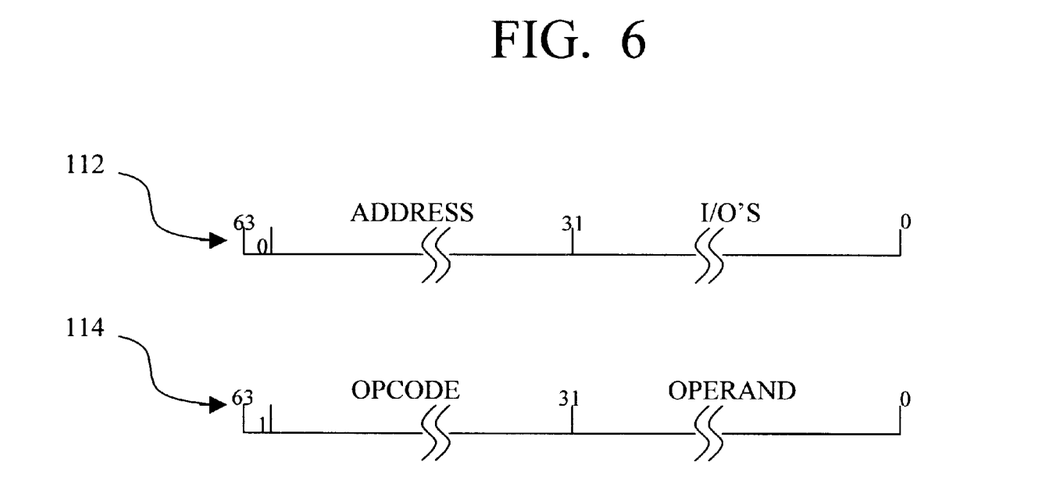
FIG. 6 is a view of two preferred data structures for use in the failure capture circuit of the present invention.

Control of a column flag memory 84 is realized through determinations made by the redundancy analyzer which identifies must-fail columns as a function of rowfailures. Referring now to FIG. 5, the screening logic 70 output feeds a transfer interface 90 that loads sparse-fail information at high speed into the address-offail look-up table 110. The transfer interface includes a 32-bit input OR gate 92 coupled to the must fail screen circuitry 71 output to receive sync-reject signals SR0 through SR31. The output of the OR gate feeds a data FIFO controller 94 that operates in cooperation with a catchram controller 96 and controls the pipelining of data through a pair of alternating 64×64 "ping-pong" FIFOs 98 and 100. The data FIFO controller includes a counter (not shown) that increments each time a fail comes in on any of the SR inputs. Each ping-pong FIFO selectively receives data from the screening logic 70 through respective data path FIFOs 102 and 104. The ping-pong FIFOs alternate in generating 64-bit outputs that form a data stream operating at twice the input data rate and configured according to unique programmable data structures that maximizes the capabilities of the address-of-fail look-up table 110.

In one embodiment, the look-up table 110, commonly referred to as a catchram, preferably comprises a semiconductor memory, such as an SDRAM device. The device includes a 64-bit wide input D/Q to sequentially load data from the ping-pong FIFOs 98 and 100 at high-speed in a full-page linear burst mode of operation.

To maximize the high-speed benefits of the catchram burst mode feature, the inventor has devised unique data structures, shown in FIG. 5, comprising respective strings of MUT address information and/or command information. An address information data structure 112 preferably includes MUT I/O pin information coded in bits 0 through 31, and the address-of-fail information in bits 32 through 62. Bit 63 is utilized to distinguish an address string from a command string. A command data structure 114, on the other hand, employs a predetermined number of bits to code an operand, with a second field of bits to identify opcode. Like the address structure, the command data structure utilizes one bit (63) to differentiate itself from the address data structure 112.

Further referring to FIG. 4, the catchram 110 includes a plurality of control inputs often associated with SDRAM devices, such as ADDR (multiplexer address), RAS (row address strobe), CAS (column address strobe), WE (write enable), CS (chip select) and CKE (clock enable). The control inputs receive respective programmed control signals from the catchram controller 96.

The catchram controller 96 is preferably configured as a finite state machine. The controller performs many control functions including bursting the catchram 110 for loading failure address information, refreshing the catchram, and coordinating the control of the ping-pong FIFOs 98 and 100 with the data FIFO controller 94. The control outputs from the controller to the catchram are reclocked through an array of registers 116 operating at a high-speed 8 nS period clock (125 MHz). The clock-domain transition also serves to maximize the operating capabilities of the catchram. Other functions governed y the controller include memory reads for redundancy analysis transfer, and system read/writes for diagnostics.

Accessing the addresses-of-fails in the catchram 110 is carried out by interface or transfer circuitry 120 (FIGS. 1 and 4) that couples the catchram to the redundancy analysis (RA) circuitry 160 (FIG. 1). The transfer circuitry includes a scanning finite-state- machine (FSM) 122 to control the transfer of data from the catchram to the RA circuitry 160, and ISE logic 124 to determine the validity of the transferred data. The scanning FSM connects to the catchram controller 96 to specify data transfers and operates according to a free-running 16 nS period clock. Registers 126 and 128 are loaded in parallel with the 8 nS clock (CLK 8), and are unloaded serially by the 16 nS clock (CLK 16). The loading and loading, together with alternating loads, provides CLK 8 to CLK 16 synchronization.

With continuing reference to FIG. 4, the transfer circuitry 120 in more detail preferably includes a 64-bit output data path 130 from the catchram D/Q's that feeds a pair of data selectors 132 and 134. The selectors receive control signals from respective AND gates 136 and 138 that evaluate load and scan command signals from the catchram controller 96 and the scanning controller 122 along respective command lines 140 and 142. The parallel outputs from the selectors are loaded into the 8 nS clock registers 126 and 128 and converted into serialized outputs by respective 64:1 parallel-to-serial (P2S) modules 144 and 146 that are controlled by the scanning controller 122 along bit-select control lines 148. The modules connect to a multiplexer 150 that selects which bitstream is transferred and, in turn, couples to an ISE FIFO 152. The ISE FIFO produces a 64-bit valid data stream to the redundancy analysis circuitry 160 with proper synchronization for the system RA independent of the pattern generator capture signals.

Much of the structure of the failure capture circuit 20 described above lends itself well to implementation in an application specific integrated circuit (ASIC) form. This is particularly beneficial for parallel testing applications where a plurality of failure capture circuits are disposed in parallel to test a corresponding parallel array of MUTs. Because of the high-density advantages associated with ASIC technology, the circuitry space required to provide testing capabilities for a large number of MUTs is substantially reduced.

In general, operation of the failure capture circuit 20 involves capturing and processing failure data from the MUT 16 for subsequent high-speed transfer to the RA circuitry 160. Because of the desirability of bit-image analyses during the redundancy analysis, large amounts of failure data are often involved, requiring high-speed operation in order to maximize the throughput of MUT testing. Data received by the RA circuitry is analyzed according to methods well known to those skilled in the art, such as that disclosed in U.S. Pat. No. 5,754,556, entitled "Semiconductor Memory Tester With Hardware Accelerators", assigned to the assignee of the present invention and expressly incorporated herein by reference. The construction and configuration of the failure capture circuit, described above, allows for operation at high-speed with maximum device density and minimal hardware costs.

Prior to operation, the tester 10 is pre-programmed to write predetermined data to selected addresses in the MUT 16. This generally involves programming the pattern generator 14 to drive test pattern waveforms, such as return to zero, return to complement, and other test waveforms well known to those skilled in the art.

During a test, the pattern generator 14 supplies waveform information to the driver circuitry 17 and supplies a copy of the test signals to the failure capture circuit 20. The driver circuitry writes the programmed waveform to the MUT. The pattern generator distribution logic 38 receives the address information from the pattern generator at the address selector 40, while the data information is received by the sync-reject logic for subsequent data comparison.

After the driver circuitry 17 writes data to the MUT 16, the capture and compare logic 22 scans selected areas of the MUT in response to subsequent pattern information, and reads the data from the selected area for comparison to the data previously sent by the pattern generator. The I/O selector 26 identifies predetermined MUT I/O pins for accessing, and steers data resources to those particular pins. This is particularly beneficial when testing a parallel array of MUTs.

The capture circuitry 25 activates in response to strobe signals generated by the pattern generator 14 to read the data from the MUT addresses selected by the I/O selection logic 26. The captured data is detected as logic high or low by each comparator (not shown) and fed to the sync-reject logic 27. The sync-reject logic then compares the detected logic level to the expected data supplied by the pattern generator. If the captured data matches the expected data, then the sync-reject logic output remains low. Should a mismatch occur, then the logic generates a sync-reject signal indicating a failed condition.

The captured failure data is then processed through the screening logic 70 to distinguish must-fail information from sparse-fail information. The inventor has discovered that the overall number of MUT failures spread out over a large population of devices tends to be fairly low, on average. As a corollary to this determination, by storing only the addresses of MUT fails in the catchram 110 rather than logic "ones" in a corresponding mirror image of the MUT, the storage capacity of the catchram may be substantially reduced. Moreover, because the catchram utilizes the high-speed burst mode of an SDRAM device, banks of interleaved memories are eliminated, reducing hardware costs and minimizing valuable space on tester channel cards.

Referring again to FIG. 4, the must-fail screen circuitry 71 counts the number of fails in the selected rows 75 (FIG. 3) with the fail counter 79. When a predetermined threshold number of fails in a particular row is detected (generally corresponding to the number of available redundant columns), then a flag is stored in the 1-bit wide row flag memory 82 corresponding to the MUT "must-fail" row. The results of both flag memories 82 and 84 are supplied to the inhibit circuitry 83 that prevents any must-fail data from occupying valuable storage space in the catchram 110.

The screening logic 70 passes sparse-fail information along the respective data path FIFOs 102 and 104, for loading the "ping-pong" FIFOs 98 and 100 in accordance with timed commands from the data FIFO controller 94. A plurality of sync-reject signals are fed to the data input of the controller 94 to count the fails loaded into the FIFOs. Generally, the FIFO controller loads one FIFO with fail information while simultaneously emptying the other FIFO in a data burst into the D/Q inputs of the catchram 110. In this manner, a continuous stream of data is loaded into the catchram at twice the maximum rate of the pattern generator clock.

As previously described above, the loading and unloading of the failure address data into and out of the catchram 110 occurs with the device operating in burst-mode. For an SDRAM device, this requires that the data be sequentially stored in the memory, rather than randomly stored. This allows the catchram to be configured such that it stores only addresses-of-fails within the MUT, rather than bit-image data stored in physical locations corresponding to the MUT. Consequently, the transfer time of failure data from the catchram to the redundancy analysis circuitry is dramatically improved, as further described below.

Referring now to FIGS. 1 and 4, the interface or transfer circuitry 120 generally accesses the catchram 110 and transmits the failure information to the RA circuitry 160 at a data rate independent from the pattern generator clock. This is beneficial in a throughput sense by allowing patterns to be applied to the MUT without waiting for a transfer from the catchram 110 to the RA circuitry 160. This benefit is even more pronounced in parallel testing applications by allowing one failure capture circuit to capture data while another circuit transfers data.

In further detail, the scanning controller 122 directs the transfer of failure data out of the catchram 110 by issuing commands to the catchram controller 96. The scanning controller also selectively activates one of the two data selector paths 132 and 134. The data selector is updated in parallel, and subsequently transferred sequentially through each bit of the data register. The high-speed clock is used to load data in parallel, while the slow-speed clock unloads the data sequentially. The slower sequential unloading of data provides sufficient time for the SDRAM controller to service refresh requests and perform the necessary operations of a burst-1 read. The process of reading memory, loading the selected register in parallel, and then transferring data serially from the selected register continues for the number of catchram memory addresses programmed in a register of the scanning finite state machine.

Those skilled in the art will appreciate the many benefits and advantages afforded by the present invention. Of significance is the storage and transfer speed advantages realized by employing a catchram that stores addresses-of-fails in a failure capture circuit. This allows one memory device to capture, store, and transfer failure information sufficient for redundancy analysis circuitry to resurrect a substantially bit-image reproduction of a MUT. Costs involved in procuring multiple banks of memory devices are consequently minimized.

Moreover, because the failure capture circuit, on average, stores less data than previously employed circuits, transfer rates from the catchram to the RA circuitry are maximized. These advantages are amplified in parallel test environments where multiple failure capture circuits are employed to test a plurality of MUTs.

While the invention has been particularly shown and described with reference to the preferred embodiments thereof, it will be understood by those skilled in the art that various changes in form and detail may be made therein without departing from the spirit and scope of the invention. For example, while the interface circuitry described herein relates to transferring data from the catchram to the redundancy analyzer, it may also couple the redundancy analyzer to a shared catchram configuration during non-transfer modes.

What is claimed is:

1. A failure capture circuit for identifying failure location information from a memory-under-test (MUT), said MUT having a predetermined storage capacity comprising a plurality of memory cells, said failure capture circuit including:

failure detection circuitry adapted for coupling to said MUT and operative to apply test signals to said MUT and process output signals from said MUT into failure information, said failure information indicative of failed memory cell locations, the failure detection circuitry including a pattern generator for applying said test signals to said memory cells;

capture logic for acquiring said output signals; and compare logic for comparing said output signals to predetermined expected signals and identifying memory cell locations that fail said comparison; and a look-up table coupled to said failure detection circuitry for storing said location information.

2. A failure capture circuit according to claim 1 and further including:

screening logic coupled to said compare logic and operative to distinguish must-fail information from sparse-fail information, said screening logic connected through a sparse-fail signal path to said look-up table to pass sparse-fail information to said look-up table and including a must-fail signal path adapted for directing said must-fail information and said sparse-fail information to a redundancy analyzer.

3. A failure capture circuit according to claim 2 wherein said screening logic includes:

a column flag memory for tracking memory cell columns that have a predetermined number of failures defining must-fail columns;

a row flag memory for tracking memory cell rows that have a predetermined number of row failures defining must-fail rows;

a row counter for counting the number of respective row failures up to said predetermined number of row failures and cooperating with said column flag memory to identify must-fail columns as a function of said row failures.

4. A failure capture circuit according to claim 1 wherein said look-up table comprises a RAM.

5. A failure capture circuit according to claim 4 wherein said RAM includes a memory capacity less than that of said MUT.

6. A failure capture circuit according to claim 4 wherein said RAM includes a multi-bit burst mode.

7. A failure capture circuit according to claim 4 wherein said RAM is adapted to store only sparse-fail information.

8. A failure capture circuit according to claim 4 wherein said RAM is adapted for storing a plurality of multi-bit signals, said signals having a preselected data structure, said RAM including:

a multi-bit input interface for receiving said multi-bit signals during said burst mode of operation; and an array of storage cells disposed in communication with said input interface for storing said multi-bit signals.

9. A failure capture circuit according to claim 8 wherein:

said multi-bit signals include address data structures having failure address and data fields indicative of the locations of failed memory cells in said MUT.

10. A failure capture circuit according to claim 9 wherein:

said multi-bit signals include command data structures having command fields representing programmed opcode.

11. A failure capture circuit according to claim 10 wherein:

said multi-bit signals include an identifier for identifying whether said data structures include said failure address information or said command information.

12. A failure capture circuit according to claim 1 and further including:

transfer circuitry for coupling said look-up table to a redundancy analysis circuit.

13. A failure capture circuit according to claim 12 wherein said transfer circuitry operates independent of said failure detection circuitry.

14. A failure processing circuit for determining failure data from a MUT and analyzing said failure data to repair said MUT, said failure processing circuit including:

a failure capture circuit including failure detection circuitry adapted for coupling to said MUT and operative to apply test signals to said MUT and process output signals from said MUT into failure information, said failure information indicative of failed memory cell locations, and a look-up table coupled to said failure detection circuitry for storing said location information;

redundancy analysis circuitry to establish a procedure for repairing said MUT; and interface circuitry coupling said redundancy analysis circuitry to said failure capture circuit, said interface circuitry operating independently of said failure detection circuitry.

15. A screening circuit for distinguishing sparse-fail information from must-fail information and selectively passing sparse-failure information representing fail data from a MUT to a failure memory, and directing must-fail information to a redundancy analyzer, said screening circuit including:

a column flag memory for tracking memory cell columns that have a predetermined number of failures defining must-fail columns;

a row flag memory for tracking memory cell rows that have a predetermined number of row failures defining must-fail rows;

a row counter for counting the number of respective row failures up to said predetermined number of row failures and cooperating with said column flag memory to identify must-fail columns as a function of said row failures.

16. A method of acquiring failure information from a MUT for subsequent redundancy analysis, said method including the steps of:

capturing said failure information;

identifying the locations of said failures inside said MUT from said failure information, said identifying step includes the step of screening said failure locations to determine must-fail data and sparse-fail data; and storing said identified failure locations in a look-up table, said storing step includes writing said sparse-fail data to said look-up table.

17. A method of screening failure information passed to a failure capture memory adapted for storing failure address information from a MUT, said capture memory accessible by a redundancy analysis circuit, said method including the steps of:

determining must-fail information;

separating said must-fail information from sparse-fail information;

passing said sparse-fail information to said capture memory; and directing said must-fail information and said sparse-fail information to said redundancy analysis circuit.

18. A method of screening failure information according to claim 17 wherein said determining step includes the steps of:

establishing a predetermined threshold number of failures for respective rows and columns in said MUT;

counting failures in each of said rows to generate a count;

detecting column failures as a function of said counted row failures; and identifying rows and/or columns as must-fail when said count meets or exceeds said predetermined threshold number of fails.

* * * * *